(12) United States Patent
Kim et al.

(10) Patent No.: US 10,079,142 B2
(45) Date of Patent: Sep. 18, 2018

(54) APPARATUS AND METHOD FOR TREATING SUBSTRATE

(71) Applicant: SEMES CO., LTD., Chungcheongnam-do (KR)

(72) Inventors: Dae Min Kim, Chungcheongnam-do (KR); Sul Lee, Incheon (KR); Bok Kyu Lee, Chungcheongnam-do (KR); Jae Myoung Lee, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 52 days.

(21) Appl. No.: 15/165,020

(22) Filed: May 26, 2016

(65) Prior Publication Data

US 2016/0351385 A1 Dec. 1, 2016

(30) Foreign Application Priority Data

May 29, 2015 (KR) .................. 10-2015-0076524

(51) Int. Cl.
*H01L 21/02* (2006.01)
*B08B 15/00* (2006.01)
(Continued)

(52) U.S. Cl.
CPC .... *H01L 21/02052* (2013.01); *C11D 11/0047* (2013.01); *H01L 21/67051* (2013.01); *H01L 21/6875* (2013.01); *B08B 2203/0229* (2013.01)

(58) Field of Classification Search
CPC ........... H01L 21/67051; H01L 21/6875; B08B 2203/0229
(Continued)

(56) References Cited

U.S. PATENT DOCUMENTS

2003/0013310 A1* 1/2003 Tomimori ................ B08B 3/04
438/703
2011/0312190 A1* 12/2011 Ichino .................... B05D 1/005
438/782
(Continued)

FOREIGN PATENT DOCUMENTS

CN 101718954 A 6/2010
CN 102421831 A 4/2012
(Continued)

OTHER PUBLICATIONS

Chinese Office Action dated Jun. 4, 2018 in corresponding Chinese Patent Application No. 201610371482.0 with English translation.
(Continued)

*Primary Examiner* — Michael E Barr
*Assistant Examiner* — Tinsae B Ayalew
(74) *Attorney, Agent, or Firm* — Carter, DeLuca, Farrell & Schmidt, LLP

(57) ABSTRACT

An apparatus for treating a substrate includes an injecting member having a first nozzle configured to supply a first chemical to the substrate that is mounted on the supporting unit, and a second nozzle configured to supply a second chemical, which is different from the first chemical, to the substrate that is mounted on the supporting unit, and a controller configured to supply the first chemical before supplying the second chemicals and to control the first chemical, which is variable according to a type of thin film on the substrate mounted on the supporting unit, to be supplied.

3 Claims, 2 Drawing Sheets

(51) Int. Cl.
  *C11D 11/00* (2006.01)
  *H01L 21/67* (2006.01)
  *H01L 21/687* (2006.01)

(58) Field of Classification Search
  USPC .......................................................... 134/26
  See application file for complete search history.

(56) References Cited

U.S. PATENT DOCUMENTS

2012/0118816 A1* 5/2012 Gjoka .................... B01D 65/10
                                                          210/506
2012/0260949 A1* 10/2012 Sekiguchi ............ C11D 7/5004
                                                          134/22.19

FOREIGN PATENT DOCUMENTS

| CN | 103474378 A | 12/2013 |
| KR | 101151777 | 7/2006 |
| KR | 101000944 | 4/2010 |
| KR | 20110138180 | 12/2011 |
| KR | 1020120117678 | 10/2012 |
| TW | 201306151 A | 2/2013 |

OTHER PUBLICATIONS

Background search of Chinese Office Action dated Jun. 4, 2018 in corresponding Chinese Patent Application No. 201610371482.0, with English translation.

* cited by examiner

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2015-0076524 filed May 29, 2015, in the Korean Intellectual Property Office, the entire contents of which are hereby incorporated by reference.

BACKGROUND

Embodiments of the inventive concept described herein relate to an apparatus and method for treating a substrate.

Contaminants such as particles, organic pollutants, and metallic pollutants, remaining on the surfaces of substrates, deteriorate characteristics and product yield of semiconductor devices. For that reason, a cleaning process for removing various kinds of contaminants are attached to the surfaces of substrates from the substrates is much important in semiconductor fabrication.

Such a process for cleaning substrates is executed before and after each unit step of semiconductor fabrication. Generally, cleaning substrates includes a chemical treatment process for removing foreign metallic substances, organic matters, or particles remaining on the substrates, a rinsing process for removing chemicals remaining on substrates by deionized water, and a drying process for drying substrates using an organic solvent, a supercritical fluid, or a nitrogen gas.

Generally, if chemicals are directly supplied on the substrates having thin films when the chemicals are supplied onto the substrate to treat the substrates during a process like the cleaning process, etc, static electricity is generated due to friction between the chemicals and the substrates to cause a delay of time for spreading the chemicals over the whole surface of the substrates. As a result, the water spots due to the chemicals that have spattered on the exposed surfaces of the substrates or fumes, generated during the process, adsorbed to the substrates damage the substrates.

SUMMARY

Embodiments of the inventive concept provide an apparatus and method for preventing static electricity which is caused by friction between substrates and chemicals.

Embodiments of the inventive concept provide an apparatus and method for shortening a time for spreading chemicals on substrates.

Embodiments of the inventive concept provide an apparatus and method for preventing damage on substrates.

Subjects according to the inventive concept may not be restrictive to the aforementioned subjects but may be clearly construed by ordinary artisans in the art from the specification and the accompanied figures.

One aspect of embodiments of the inventive concept is directed to provide an apparatus for treating a substrate, including a housing configured to provide an internal space for a substrate treating process, a supporting unit on that the substrate is mounted in the housing, an injecting member having a first nozzle configured to supply a first chemical to the substrate that is mounted on the supporting unit, and a second nozzle configured to supply a second chemical, which is different from the first chemicals, to the substrate that is mounted on the supporting unit, and a controller configured to supply the first chemical before supplying the second chemical and to control the first chemical, which is variable according to a type of thin film on the substrate mounted on the supporting unit, to be supplied.

The controller may be configured to control the first chemical to be supplied as a chemical, which contains isopropyl alcohol, if the thin film is a hydrophobic film.

The controller may be configured to control the first chemical to be supplied as a chemical, which contains deionized water, if the thin film is a hydrophilic film.

Another aspect of embodiments of the inventive concept is directed to provide a method for treating a substrate, including pre-treating the substrate by supplying a pre-wetting chemical to the substrate, and treating the substrate by supplying a treatment chemical to the substrate after the pre-treating, wherein the pre-treating comprises supplying the pre-wetting chemical that is variable according to a type of thin film on the substrate.

If the thin film is a hydrophobic film, the pre-wetting chemical may contain isopropyl alcohol.

If the thin film is a hydrophilic film, the pre-wetting chemical may contain deionized water.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereafter, embodiments of the inventive concept will be described in conjunction with the accompanied figures. Embodiments of the inventive concept may be modified in various forms and the scope of the inventive concept may not be construed as restricting the following embodiments. These embodiments will be provided to help those skilled in the art to fully comprehend the inventive concept as possible. Shapes or patterns of the accompanied figures are exaggerated for more clearly illustrating structural configurations of elements in the figures.

Embodiments of the inventive concept will be described about a substrate treating apparatus for cleaning substrates. However, the inventive concept may not be restrictive and rather may be applicable to various kinds of apparatuses for spreading a chemical on substrates.

Figure 1:
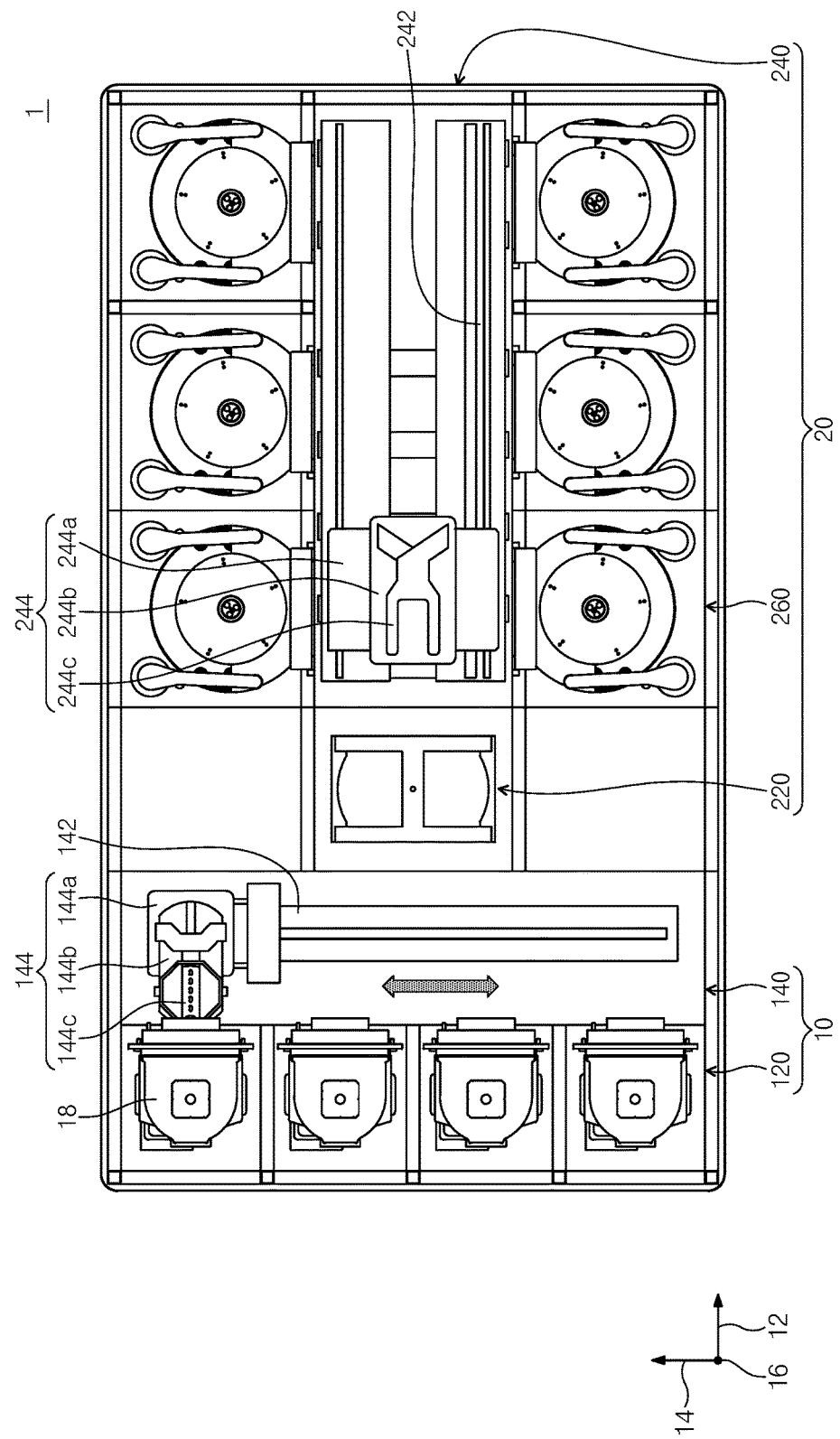
FIG. 1 is a plane view schematically illustrating an example of substrate treating equipment having a substrate treating apparatus according to an embodiment of the inventive concept.
Figure 2:
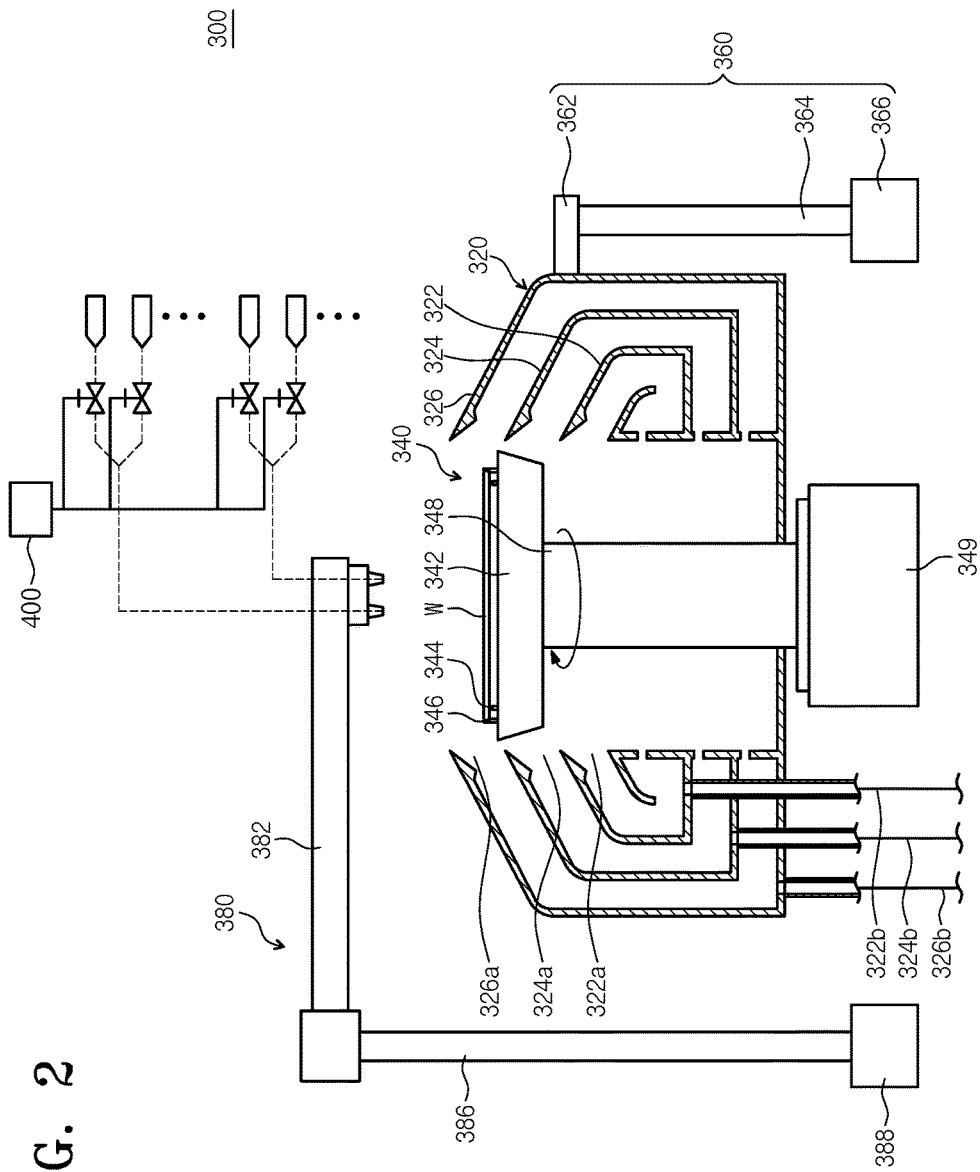
FIG. 2 is a sectional view illustrating an example of a substrate treating apparatus which is provided to the processing chamber of FIG. 1.

Hereafter embodiments of the inventive concept will be detailed in conjunction with FIGS. 1 and 2.

FIG. 1 is a plane view schematically illustrating an example of substrate treating equipment 1 having a substrate treating apparatus according to an embodiment of the inventive concept.

Referring to FIG. 1, the substrate treating equipment 1 may include an index module 10 and a process execution module 20. The index module 10 may include a load port 120 and a transfer frame 140. The load port 120, the transfer frame 140, and the process execution module 20 may be arranged in sequence. An arrangement direction of the load port 120, the transfer frame 140, and the process execution module 20 will be hereafter referred to 'first direction 12'. The direction vertical to the first direction 12 in view of the top of the equipment will be hereafter referred to as 'second direction 14'. The direction vertical to a plane including the first direction 12 and the second direction 14 will be hereafter referred to as 'third direction 16'.

A carrier accommodating a substrate W may be settled in the load port 120. The load port 120 may be provided in plurality. A plurality of load ports 120 may be arranged in a line along the second direction 14. Although FIG. 1 is illustrated as having four load ports 120, the number of the load ports 120 may even increase or decrease in accordance with conditions such as footprints and processing efficiency of the process execution module 20. In the carrier, a slot (not shown) may be formed to support the edge of the substrate W. The slot may be provided in plurality along the third direction 16 and the substrates W may be stacked in the carrier, being isolated each other in the third direction 16. The carrier may be used with a Front Opening Unified Pod (FOUP).

The process execution module 20 may include a buffer unit 220, a transfer chamber 240, and a processing chamber 260. The lengthwise direction of the transfer chamber 240 may be parallel with the first direction 12. The processing chambers 260 may be arranged at one side and the other side of the transfer chamber 240 in the second direction 14. The processing chambers 260 placed at one side of the transfer chamber 240 may be symmetrical with the processing chambers 260, which are placed at the other side of the transfer chamber 240, relative to the transfer chamber 240. A part of the processing chambers 260 may be arranged along a lengthwise direction of the transfer chamber 240. Additionally, a part of the processing chambers 260 may be stacked each other. For example, the processing chambers 260 may be disposed in the arrangement of A×B (A and B are natural numbers equal to or larger than 1) at one side of the transfer chamber 240. The A denotes the number of the processing chambers 260 which are arranged in a line along the first direction 12 and the B denotes the number of the processing chambers 260 which are arranged in a line along the third direction 16. In the case of providing the processing chambers 260 with four or six at one side of the transfer chamber 240, the processing chambers 260 may be disposed in the arrangement of 2×2 or 3×2. The number of the processing chambers 260 may even increase or decrease. Different from the aforementioned configuration, the processing chambers 260 may be provided only at one side of the transfer chamber 240. Additionally, different form the aforementioned, the processing chambers 260 may be provided in a single layer at one side and the other side of the transfer chamber 240.

The buffer unit 220 may be disposed between the transfer frame 140 and the transfer chamber 240. The buffer unit 220 may provide a space, in which a substrate W stays before being carried, between the transfer chamber 240 and the transfer frame 140. The buffer unit 220 may internally provide slots (not shown) on which the substrates W are laid, and the slots (not shown) may be provided in plurality with isolation each other in the third direction 16. In the buffer unit 220, a surface facing the transfer frame 140 and a surface facing the transfer chamber 240 may be open respectively.

The transfer frame 140 may carry the substrate W between the buffer unit 220 and the carrier which is settled in the load port 120. The transfer frame 140 may be provided with an index rail 142 and an index robot 144. The lengthwise direction of the index rail 142 may be arranged along the second direction 14. The index robot 144 may be installed on the index rail 142 and may move in a straight course along the second direction 14 along the index rail 142. The index robot 144 may include a base 144*a*, a body 144*b*, and an index arm 144*c*. The base 144*a* may be installed to be movable along the index rail 142. The body 144*b* may be coupled with the base 144*a*. The body 144*b* may be provided to be movable along the third direction 16 on the base 144*a*. Additionally, the body 144*b* may be provided to be rotatable on the base 144*a*. The index arm 144*c* may be coupled with the body 144*b* and may be provided to be movable forward and backward to the body 144*b*. The index arm 144*c* may be provided in plurality and each index arm 144*c* may be driven individually. The index arms 144*c* may be stacked with isolation each other along the third direction 16. A part of the index arms 144*c* may be used to carry the substrate W from the process execution module 20 to the carrier, and the other part of the index arms 144*c* may be used to carry the substrate W from the carrier to the process execution module 20. This may prevent particles, which are generated from the substrate W before process execution while carrying in and out the substrate W through the index robot 144, from being absorbed to the substrate W after process execution.

The transfer chamber 240 may carry the substrate W between the buffer unit 220 and the processing chamber 260, and between the processing chambers 260. The transfer chamber 240 may be provided with a guide rail 242 and a main robot 244. The lengthwise direction of the guide rail 242 may be arranged along the first direction 12. The main robot 244 may be installed on the guide rail 242 and may move in a straight course along the first direction 12 on the guide rail 242. The main robot 244 may include a base 244*a*, a body 244*b*, and a main arm 244*c*. The base 244*a* may be installed to be movable along the guide rail 242. The body 244*b* may be coupled with the base 244*a*. The body 244*b* may be provided to be movable along the third direction 16 on the base 244*a*. Additionally, the body 144*b* may be provided to be rotatable on the base 244*a*. The main arm 244*c* may be coupled with the body 244*b* and may move forward and backward to the body 244*b*. The main arm 244*c* may be provided in plurality and each main arm may be driven individually. The main arms 244*c* may be stacked with isolation each other along the third direction 16. The main arms 244*c* used to carry the substrate W into the processing chamber 260 from the buffer unit 220 may be different from the main arm 244*c* used when carrying the substrate W to the buffer unit 220 from the processing chamber 260.

The processing chamber 260 may be internally provided with a substrate treating apparatus 300 for performing a process for cleaning the substrate W. The substrate treating apparatus 300 provided in each of the processing chambers 260 may be variably structured in accordance with a kind of cleaning process. Selectively, the substrate treating apparatuses 300 provided respectively in the processing chambers 260 may be the same in a structure. Selectively, the processing chambers 260 may be divided into a plurality of groups. The substrate treating apparatuses 300 provided to the processing chambers 260 of the same group may be same in a structure. The substrate treating apparatuses 300 provided to the processing chambers of different groups may be different in structures. For example, in the case of dividing the processing chambers 260 into two groups, the processing chambers 260 of a first group may be provided to one side of the transfer chamber 240 while the processing chambers 260 of a second group may be provided to the other side of the transfer chamber 240. Selectively, the processing chambers 260 of the first group may be provided to a lower layer of the transfer chamber 240 at one side and the other side of the transfer chamber 240. The processing chambers 260 of the second group may be provided to an upper layer of the transfer chamber 240 at one side and the other side of the transfer chamber 240. The processing chambers 260 of the first group may be differentiated from the processing chambers 260 of the second group in accordance with kinds of chemicals or cleaning modes.

Now, an example of the substrate treating apparatus 300 for cleaning the substrate W with a treatment chemical will be described hereinafter. FIG. 2 is a sectional view illustrating an example of a substrate treating apparatus 300. Referring to FIG. 2, the substrate treating apparatus 300 may include a housing 320, a supporting unit, an elevating unit 360, an injecting member 380, and a controller 400.

The housing 320 may provide a space for executing a substrate treating process. The top of the housing 320 may be open. The housing 320 may include an internal recovery tube 322, an intermediate recovery tube 324, and an external recovery tube 326. The recovery tubes 322, 324, and 326 may recover treatment chemicals of different kinds which are used in fabrication processes. The internal recovery tube 322 may be shaped in a ring of loop type surrounding a spin head 340. The intermediate recovery tube 324 may be shaped in a ring of loop type surrounding the internal recovery tube 322. The external recovery tube 326 may be shaped in a ring of loop type surrounding the intermediate tube 324. An internal space 322a of the internal recovery tube 322, a space 324a between the internal recovery tube 322 and the intermediate recovery tube 324, and a space 326a between the intermediate recovery tube 324 and the external recovery tube 326 may function as inlets through which treatment chemicals flow into the internal recovery tube 322, the intermediate recovery tube 324, and the external recovery tube 326 respectively. The recovery tubes 322, 324, and 326 may be connected with recovery pipelines 322b, 324b, and 326b which are vertically elongated toward the bottoms of the recovery tubes 322, 324, and 326. The recovery pipelines 322b, 324b, and 326b may exhaust treatment chemicals which flow thereinto respectively through the recovery tubes 322, 324, and 326. The exhausted treatment chemicals may be recycled through an external recycling system (not illustrated).

The supporting unit may be provided in the housing 320. The substrate W may be laid on the supporting unit. The supporting unit may be provided with a spin head 340. According to an embodiment, the spin head 340 may be disposed in the housing 320. The spin head 340 may support and spin the substrate W during a process. The spin head 340 may include a body 342, a supporting pin 344, a chuck pin 346, and a supporting axis 348. The body 342 may have a round top surface in view of the top of the apparatus. The bottom of the body 342 may be fixedly coupled with the supporting axis 348 which is rotatable by a motor 349. The supporting pin 344 may be provided in plurality. The supporting pins 344 may be arranged with isolation each other in a specific interval at the edge of the top surface of the body 342 and may be protruded upward from the body 342. The supporting pins 344 may be arranged to have a ring shape of loop type overall by a combination of the supporting pins 344. The supporting pins 344 may support the rear edge of the substrate W to isolate the substrate W in a specific distance from the top surface of the body 342. The chuck pin 346 may be provided in plurality. The chuck pin 346 may be isolated far from the center of the body 342 more than the supporting pin 344. The chuck pin 346 may be protruded upward from the body 342. The chuck pin 346 may support a side of the substrate W to prevent the substrate W from being separated out of its original position when the spin head 340 is rotating. The chuck pin 346 may be movable in a straight course along a radius direction of the body 342 between a standby position and a supporting position. The standby position is more distant than the supporting position from the center of the body 342. The chuck pin 346 may be placed at the standby position when the substrate W is loaded or unloaded to the spin head 340, and may be placed at the supporting position when a process is being executed for the substrate W. At the supporting position, the chuck pin 346 may be in contact with a side of the substrate W.

The elevating unit 360 may move the housing 320 up and down in a straight course. According to the up and down movement of the housing 320, the housing 320 may be changed in a relative height to the spin head 340. The elevating unit 360 may include a bracket 362, a moving axis 364, and a driver 366. The bracket 362 may be fixed on an outer wall of the housing 320. The bracket 362 may be fixedly coupled with the moving axis 364 which moves up and down by the driver 366. The housing 320 may be descended to allow the spin head 340 to be protruded toward the top of the housing 320 when the substrate W is being laid on or lifted from the spin head 340. Additionally, during a process, the housing 320 may be adjusted in a height to allow a treatment chemical to flow into the recovery tube 360, which is predetermined, in accordance with a kind of treatment chemical which is supplied to the substrate W. For example, while the substrate W is being treated with a first treatment chemical, the substrate W may be placed on a height corresponding to the inner space 322a of the internal recovery tube 322. Additionally, while the substrate W is being treated with a second treatment chemical and a third treatment chemical, the substrate W may be placed on heights corresponding respectively to the space 324a between the internal recovery tube 322 and the intermediate recovery tube 324 and the space 326a between the intermediate recovery tube 324 and the external recovery tube 326. Different from the aforementioned, the elevating unit 360 may move the spin head 340 up and down instead of the housing 320.

The injecting member 380 may supply a chemical to the substrate W during a substrate treating process. The injecting member 360 may include a nozzle support 382, a first nozzle 384, a second nozzle 385, a supporting axis 386, and a driver 388.

The lengthwise of the supporting axis 386 may be provided along the third direction 16 and a lower end of the supporting axis may be coupled with the driver 388. The driver 388 may rotate and elevate the supporting axis 386. The nozzle support 382 may be vertically coupled with the opposite of an end of the supporting axis 386 which is coupled with the driver 388. The first nozzle 384 and the second nozzle 385 may be installed at the bottom of an end of the nozzle support 382. The first nozzle 384 and the second nozzle 385 may move toward a processing position and a standby position by the driver 388. The processing position may correspond to where the first nozzle 384 and the second nozzle 385 are placed at a vertical top of the housing 320. The standby position may correspond to where the first nozzle 384 and the second nozzle 385 are out of the vertical top of the housing 320. The injecting member 380 may be provided in one or plurality. In the case of providing a plurality of the injecting members 380, the plural injecting members 380 may inject different chemicals.

The first nozzle 384 may supply the first chemicals to the substrate W which is mounted on the spin head 340. The first nozzle 364 may be connected with containers for storing the first chemicals of different kinds through their respective supply pipelines. The supply pipelines may be equipped with their respective valves.

The second nozzle 385 may supply the second chemicals to the substrate W which is mounted on the spin head 340. The second chemicals may be different from the first chemicals in kinds. The second nozzle 385 may be connected with containers for storing the second chemicals of different kinds through their respective supply pipelines. The supply pipelines may be equipped with their respective valves.

The controller 400 may control the first nozzle 384 to supply the first chemical through the first nozzle 384 before supplying the second chemical through the second nozzle 385. For example, in a pre-treatment step of supplying a pre-wetting chemical to the substrate W before a treating step of supplying a treatment chemical to the substrate W, the first chemical may be the pre-wetting chemical in the pre-treatment step and the second chemical may be the treatment chemical which is supplied to the substrate W in the treatment step.

According to an embodiment, in the pre-treatment step, the controller 400 may control the first chemical, which is variable according to a kind of thin film on the substrate W, to be supplied to the substrate W. The first chemical may be a pre-wetting chemical which has the functionality of minimizing friction with a thin film in accordance with a kind of the thin film on the substrate W. For example, in the case that a thin film on the substrate W is a hydrophobic film, the controller 400 may open one, which is connected with a container storing isopropyl alcohol (ISP), among the valves connected with the first nozzle 384 and may close other valves, then supplying the isopropyl alcohol onto the substrate W. Additionally, in the case that a thin film on the substrate W is a hydrophilic, the controller 400 open one, which is connected with a container storing deionized water, among the valves connected with the first nozzle 384 and may close other valves, then supplying the deionized water onto the substrate W.

Additionally, in the treatment step, the controller 400 may control the second chemical, which is variable according to a kind of thin film or process on the substrate W mounted on the spin head 340, to be supplied to the substrate W. For example, in the case that a thin film on the substrate W is a hydrophobic film, the controller 400 may open one, which is connected with a container storing a basic chemical, among the valves connected with the second nozzle 385 and may close other valves, then supplying the basic chemical onto the substrate W. Additionally, in the case that a thin film on the substrate W is a hydrophilic, the controller 400 open one, which is connected with a container storing an acidic chemical, among the valves connected with the second nozzle 385 and may close other valves, then supplying the acidic chemical onto the substrate W. Otherwise, the controller 400 may control the chemicals to be properly supplied to the substrate W, regardless of acidity of the chemicals, in accordance with a kind of process.

As describe above, the substrate W may become wet for a shorter time period than in the case of directly spreading the treatment liquid onto the substrate W by supplying a pre-wetting chemical, which may reduce friction with the substrate W, variable in accordance with the kind of the thin film on the substrate W, so that a damage to the substrate W may be prevented by preventing fumes or spattered treatment liquid from being adsorbed onto the substrate W. Additionally, as the substrate W is provided in a wet state due to the pre-wetting chemical, it may be permissible to spread a treatment chemical on the substrate W in a shorter time than the case of directly spreading the treatment chemical on the substrate W.

An apparatus and method according to an embodiment of the inventive concept may prevent static electricity which is caused from friction between substrates and chemicals.

An apparatus and method according to an embodiment of the inventive concept may shorten a time for spreading chemicals on substrates.

An apparatus and method according to an embodiment of the inventive concept may prevent damage on substrates.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. Substrate treating equipment, comprising:
   an index module including at least one load portion and a transfer frame;
   a process execution module including a buffer unit, a transfer chamber, and at least one processing chamber; and
   an apparatus for treating a substrate, the apparatus disposed within the at least one processing chamber of the process execution module and including:
      a housing configured to provide an internal space for a substrate treating process;
      a supporting unit on that the substrate is mounted in the housing;
      an injecting member having a first nozzle configured to supply a pre-treatment chemical to the substrate that is mounted on the supporting unit, and a second nozzle configured to supply a treatment chemical, which is different from the pre-treatment chemical, to the substrate that is mounted on the supporting unit, wherein the first nozzle is connected to containers storing a plurality of first chemicals, and the second nozzle is connected to containers storing a plurality of second chemicals; and
      a controller configured to supply the pre-treatment chemical before supplying the treatment chemical and to select, based on a type of a thin film on the substrate, the pre-treatment chemical among the plurality of first chemicals and the treatment chemical among the plurality of second chemicals to reduce friction between the substrate and the pre-treatment or treatment chemical.

2. The substrate treating equipment of claim 1, wherein the controller is configured to select the pre-treatment chemical, which contains isopropyl alcohol, if the thin film is a hydrophobic film.

3. The substrate treating equipment of claim 1, wherein the controller is configured to select the pre-treatment chemical, which contains deionized water, if the thin film is a hydrophilic film.

* * * * *